US005322979A

United States Patent [19]

Cassity et al.

[11] Patent Number: 5,322,979

[45] Date of Patent: Jun. 21, 1994

[54] SPEAKER COVER ASSEMBLY

[76] Inventors: Terry A. Cassity, 438 Bourbon Acres, Paris, Ky. 40361; Bill R. Unseld, 1279 Narragansett Park, Lexington, Ky. 40517

[21] Appl. No.: 817,901

[22] Filed: Jan. 8, 1992

[51] Int. Cl.[5] .............................................. H05K 5/00

[52] U.S. Cl. .................................... 181/150; 181/199

[58] Field of Search ............... 181/148, 149, 150, 153, 181/171, 172, 174, 199; 381/87, 88, 188

[56] References Cited

U.S. PATENT DOCUMENTS 4,244,096 1/1981 Kashichi ......................... 181/199 X

*Primary Examiner*—Michael L. Gellner
*Assistant Examiner*—Khanh Dang
*Attorney, Agent, or Firm*—Larry I. Golden; Kareem M. Irfan

[57] ABSTRACT

The invention provides for an improved speaker cover assembly for mounting a speaker cover over a speaker housing that is mounted with a speaker support frame structure in a wall, cabinet, or the like. The cover assembly includes a one-piece, unitary molded frame body which is characterized by a flattened, annular-shape defining an open central region.

17 Claims, 1 Drawing Sheet

SPEAKER COVER ASSEMBLY

RELATED APPLICATION

Related co-pending U.S. application Ser. No. 07/817,899 filed on even date herewith and discloses one class of speaker support frame structures which is suitable for use in combination with the Speaker Cover Assembly of the present invention. The entire teaching and disclosure of that co-pending application incorporated hereinto by reference.

FIELD OF THE INVENTION

This invention relates to an improved speaker cover assembly for mounting of a speaker cover over a speaker housing that is mounted with a support frame structure in a wall, cabinet or the like.

BACKGROUND OF THE INVENTION

Friedman Fr. Pat. No. 2,520,181 discloses a speaker support frame structure which is held across a mounting orifice pre-formed in a wall board by means of screw pivoted clips. A flange of this Friedman frame structure outwardly extends adjacent to the forward side of the wall board at the orifice and is associated with the screw clips. With the Friedman frame structure, no speaker cover or grill is provided for association with peripheral portion of the frame structure after the speaker is mounted to the frame structure. A speaker grill is only associated with the face of the speaker.

Koshimura U.S. Pat. No. 4,860,369 also discloses a screw clip wall-mounted speaker support frame structure with the speaker here being of the flat type. No cover member is provided which over fits the support frame as well as the mounted speaker.

The art needs a new and improved speaker cover assembly with versatility for mounting on a wall, cabinet or the like. To be versatile in its application, the speaker cover assembly must have a configuration which is strong and yet, for aesthetic reasons, not overly bulky. Preferably, different materials can be used as a speaker cover without needing different frame structures to support the same. The present invention provides such an improved speaker cover assembly.

SUMMARY OF THE INVENTION

This invention provides an new and improved speaker cover assembly for mounting of a speaker cover over a speaker housing that is mounted with a speaker support frame structure in a wall, cabinet, or the like.

The cover assembly includes a frame body which is a one-piece, unitary, molded material, preferably plastic, and which is characterized by having a flattened, annular-shape defining an open central region. The frame body includes a front and back side. The back side incorporates means for disengagingly attaching to the speaker support frame structure. The back side further incorporates a first and second upstanding rib extending at least a portion of the length of the frame body and defining a U-shaped channel between them. The first rib is located nearest the open central region, the second rib is periodically cutback to define a plurality of notches wherein only the first rib upstands from the frame body.

The cover assembly also includes a one-piece unitary speaker cover for substantially covering the open region. The speaker cover is attached to the frame body. Preferably, the speaker cover is made of a grill-like malleable metal material or a cloth-like material and extends over the full portion of the frame body.

Preferably, the attachment means includes prongs which upstand in a perpendicular position from the back side of the frame body. The prongs are periodically spaced to frictionally engage corresponding apertures in the speaker support frame structure. The back side of the frame further includes a number of reinforcing ribs located in close proximity to each prong. Each reinforcing rib extends generally across the width of the frame body adjacent to the base of each prong to provide improved reinforcement of the frame body.

The present invention also includes a speaker support frame assembly for mounting a speaker on a wall, cabinet, or the like. The speaker assembly includes a speaker support frame structure having a front side and a back side. The speaker support frame structure has an open central region for receiving therethrough body portions of the speaker and a flattened perimeter region extending about the open central region and adapted for making abutting engagement with the speaker.

The speaker assembly also includes a one-piece, unitary, molded frame body having a flattened, annular-shape defining an open central region. The frame body includes a front and back side. The back side includes means for disengagingly attaching to the speaker housing support frame. The back side also incorporates a first and second upstanding rib extending at least a portion of the length of the frame body and defining a U-shaped channel between them. The first rib is located nearest the open central region. The second rib is periodically cutback to define a plurality of notches wherein only the first rib upstands from the rib body.

The speaker assembly further includes a one-piece, unitary speaker cover for substantially covering the open region. The cover attaches to the frame body.

Other and further objects, aims, features, advantages, purposes, embodiments, variations and the like will be apparent to those skilled in the art from the teachings of the present specification taken with the accompanying drawings and the appended claims.

DETAILED DESCRIPTION

Figure 1:
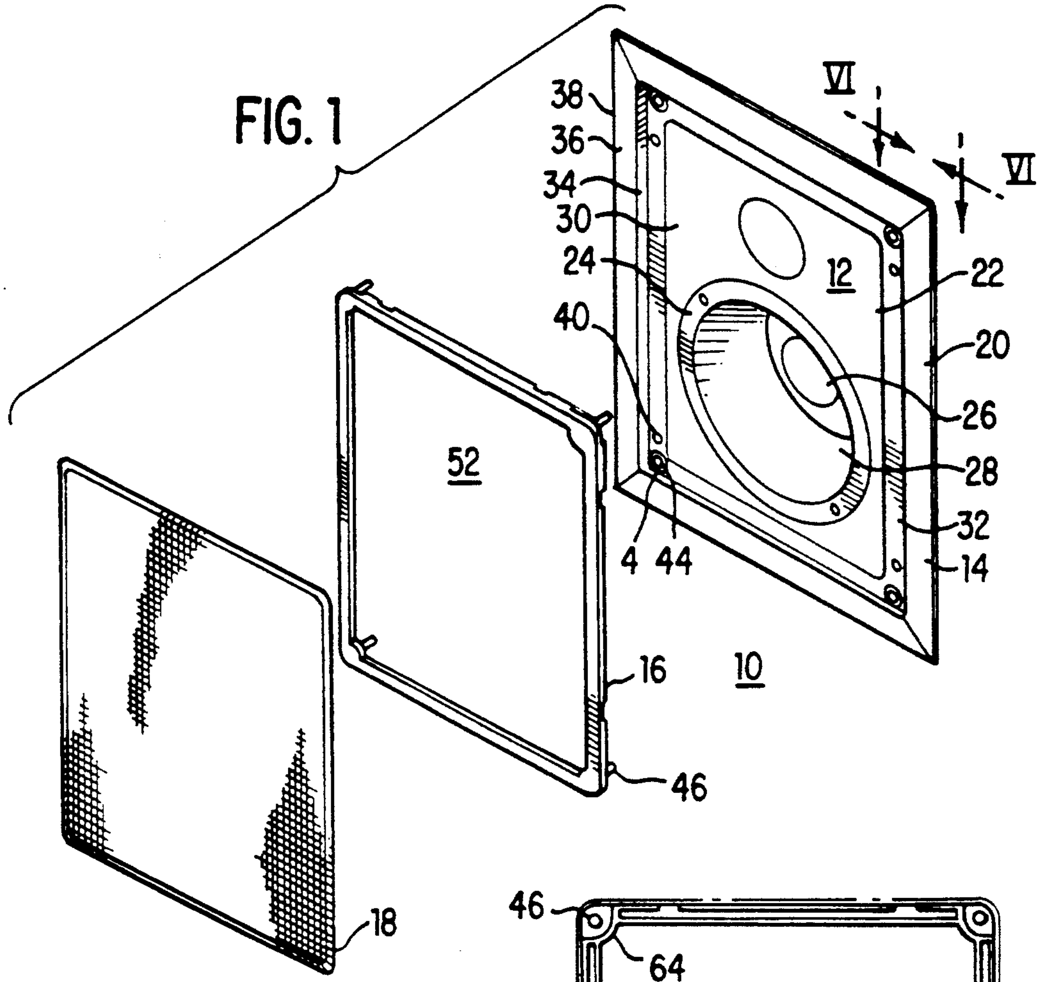
FIG. 1 is a perspective view of one embodiment of a speaker housing support frame of this invention which is shown in disassembled combination with a speaker housing mounted in a speaker support frame, a speaker cover support frame body and speaker cover.

Referring to the drawing there seen in FIGS. 1–6 an embodiment 10 of a speaker cover assembly of the present invention which is shown disassembled into three main components: a speaker housing 12 attached to a speaker support frame 14 structure, a frame body 16, and a speaker cover 18.

A speaker support frame structure 14 is preferably a one-piece molded unit comprised of plastic which has a front side 20. The frame 14 has an open central region or aperture 22 which is adapted to receive therethrough body portions of the housing basket (or frame) 24 of speaker 12. These body portions includes the portion 26 which houses the speaker magnet and the portion 28 which houses a conically tapered speaker cone. The speaker housing 24 further includes an outwardly frontal flange or rim 30 that is used for mounting speaker 12.

As those skilled in the art will appreciate, an assembly 10 can be adapted and configured for usage with a wide variety of speaker structures. Although a speaker with a cross-sectional rectangular shape (proceeding rearwardly from the frontal flange) is illustratively shown, other speaker shapes can be utilized and a single speaker assembly can involve more than one speaker cone. For example, a single speaker assembly can involve two or more associated speakers, each one of which is adapted to reproduce sound over a particular pre-determined frequency range (not illustrated). Thus, instead of the rectangular configuration shown, the aperture 22 can have another configuration which is particularly well adapted for receipt therethrough of a particular speaker assembly, such as a circular or square perimeter configuration.

The speaker support frame structure 14 has a flattened perimeter region 32 which extends about the aperture 22. The perimeter region 32 has an outer face that is adapted to make abutting engagement with back region of the speaker flange 30.

Preferably, the speaker support frame structure 14 also has a shoulder region 34 that upstands frontally from, and that extends peripherally about, the perimeter region 32. Preferably, the shoulder region 34 is in a laterally adjacent position to the periphery of speaker flange 30.

The speaker support frame structure 14 further has an outwardly turned, flattened collar region 36 that extends peripherally about the shoulder region 34. The collar region 36 has peripheral outer edge portions 38 that are angled backwardly and are adapted to make contact with the exterior side of a wall, cabinet or the like, in a laterally spaced relationship to the aperture 22. The perimeter configuration of outer portions 38 can be as desired, including the rectangular configuration shown, or otherwise, such as a square or circular configuration. The configuration of the outer portions 38 need not be related to the configuration of a given speaker, or to the shape of a given aperture 22, as those skilled the art will readily appreciate. Preferably, the size of the aperture 22 is slightly greater than the size of the shoulder region 34 so that the frame 14 is generally loosely accommodated by the aperture 22.

The perimeter region 32 has a plurality of apertures or orifices 40 defined therein which extends transversely therethrough. The individual orifices 40 are located substantially in the region of the perimeter portion 32 at perimetrically space intervals (preferably equal) that are located about, and are adjacent to, the shoulder region 34 and also to the aperture 22. The number of orifices 40 can preferably be in the range of about 3 to 5, and most preferably is about 4, but more or less orifices 40 can be used if desired.

The orifices 40 are located so as to alignable with respective orifices (not shown) that extend transversely through the speaker flange 30 of speaker 12 at spaced intervals. Thus, the speaker is mounted to the speaker support frame structure 14 by aligning the orifices 40 and extending a screw 42 through each orifice for a threadable engagement with an adjacent orifice.

The perimeter region 32 has a plurality of holes 44 defined therein which extend transversely therethrough. The individual holes 44 are located substantially in the perimeter region 32 at perimetrically spaced intervals (preferably equal) that are located about, and adjacent to the shoulder region 34 and also to the aperture 22. The number of holes 44 can preferably be in the range of about 3 to about 5, and most preferably is about 4, but more or less holes can be used if desired.

Figure 6:
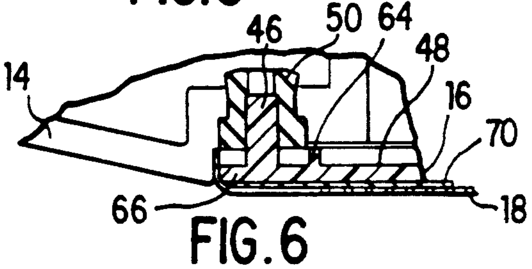
FIG. 6 is an enlarged fragmentary transverse sectional view taken along the line VI—VI of FIG. 1 illustrating the embodiment in its assembled form.
Figure 3:
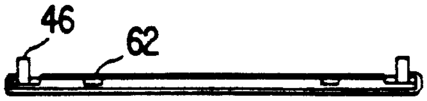
FIG. 3 is a top elevational view of the embodiment shown in FIG. 1 with the prongs outwardly extended and notches in a rib.

The holes 44 are located so s to alignable with respective prongs 46 that extend perpendicularly from the back side 48 of the cover support frame body 16. Thus, the frame body 16 is mounted to the speaker housing support frame by aligning the holes 44 with the prongs 46 and extending the prong 46 through each hole 44 for a frictional engagement with a press-fit type arrangement such as shown in FIG. 6. To improve the frictional engagement between the prong 46 and the hole 44, grommet 50 encircles the hole 44.

The cover support frame body 16 is a one-piece, unitary, molded unit, preferably made of plastic having a flattened, annular-shape which defines an open central region 52. The front side 54 of the frame body 16 is generally flat. The back side 48 has a first and second upstanding rib, respectively 56 and 58, extending at the least a portion of the length of the frame body. The first and second ribs 56, 58, define a U-shaped channel 60 between them. The first rib 56 is located nearest the central region 52. The second rib 58 is periodically cutback to define a plurality of notches 62 wherein only the first rib 56 upstands from the frame body 16.

The back side 48 of the frame body also includes reinforcing ribs 64 located in close proximity to each prong 46. Each reinforcing rib 64 extends generally across the width of the frame body 16 adjacent to the base of each prong 46. The reinforcing rib 64 improve the sturdiness of the frame body 16 and adds more support to the disengaging attachment between the prongs 46 of the frame body 16 and the holes 14.

Another component of the speaker support frame structure 10 is the speaker cover 18. Preferably, the speaker cover 18 has a perforated, cross-hatch or grill-like appearance and extends substantially over the portion of the open central region 52. As can be appreciated, the speaker cover 18 can extend to varying degrees over the speaker support frame structure 14 as well. Again, the configuration of the speaker cover 18 may not be related to the configuration of the open central region 52 or to the shape of the speaker support frame structure 14, as those skilled in the art will readily appreciate.

Preferably, the speaker cover 18 is made of a malleable metal such as stainless steel or a cloth-like material which can be stretch over the open central region 52. The present invention contemplates other materials which are suitable for allowing the acoustical vibrations from the speaker 12 to sufficiently pass through the material. It is also desirable if the material can bend or wrap around the side edge of the frame body 16 as hereinafter will be described.

Figure 4:
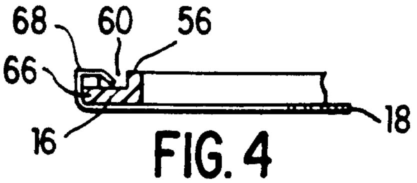
FIG. 4 is an enlarged fragmentary cross-sectional view taken along the line IV—IV of FIG. 2.
Figure 5:
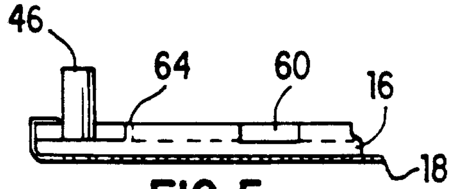
FIG. 5 is an enlarged fragmentary cross-sectional view taken along the line V—V of FIG. 3.
Figure 2:
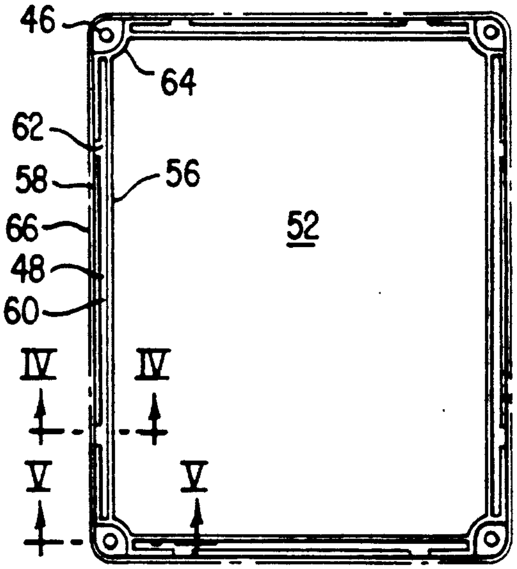
FIG. 2 is a rear elevational view of the embodiment shown in FIG. 1 with the prongs and ribs outwardly extended.

In a preferred embodiment, the speaker cover 18 is made of a malleable metal which can be bent around the side edge 66 of the second rib 58 in combination with the frame body 16. The speaker cover 18 is then bent over the top 68 of the second rib 58. Finally, the speaker cover 18 is bent into the channel 60 as shown in FIG. 4.

Made of a more flexible cloth-like material, the speaker cover 18 will wrap around the side edge 66 of the frame body 14 and over the top 68 of rib 56. The speaker cover 18 is then wrapped in the channel 60 where it can be retained so as to stretch across the open central region 52. When assembled with the speaker support frame structure 14, the speaker cover 18 is pinched against the top 68 of rib 56. This helps to retain the speaker cover 18 tautly across the assembly 10.

The notches 62 play an important part in disengaging the frame body 16 from the speaker housing support frame structure 14. Since the first rib is absent at the place of the notch 62, the notch 62 defines a depression, whereas the speaker cover 18 is otherwise pulled over the top 68 of rib 56. This depression offers a space between the frame body 16 and the speaker support frame structure 14 allowing a prying motion to be exerted between the two pieces. The notches 62 in combination with the ribs 56, 58 and 64 which reinforce the frame body 16 allows easier disengaging of the two pieces.

Preferably a foam-like gasket 70 or sheet is positioned between the speaker cover and the frame body 16. Other suitable materials which improve the fit between the two pieces are also contemplated by the present invention. Any material which offers cushioning and resistance to vibration between the two pieces is suitable for use.

Although the invention has been described in reference to particular embodiments and applications, the invention is susceptible other application which will be apparent to these skilled in the art.

We claim:

1. A speaker cover assembly for association with a speaker housing that is mounted on a speaker support frame structure in a wall, cabinet, or the like, the cover assembly comprising:

a one-piece, unitary, molded frame body having a flattened, annular-shape defining an open central region, the frame body having a front and back side, the back side having means for disengagingly attaching to the speaker support frame structure, the back side further having a first and second upstanding rib extending at least a portion of the length of the frame body and defining a U-shaped channel between them, the first rib located nearest to the open central region, the second rib periodically cutback to define a plurality of notches wherein only the first rib upstands from the frame only; and a one-piece, unitary, speaker cover for substantially covering the open central region, the speaker cover attached to the frame body.

2. The cover assembly of claim 1 wherein the assembly further includes a foam-like gasket positioned between the speaker cover and the front side of the frame body.

3. The cover assembly of claim 1 wherein the attachment means further includes a plurality of prongs upstanding in a perpendicular position from the back side of the frame body, the prongs periodically spaced to frictionally engage corresponding apertures in the speaker support frame structure.

4. The cover assembly of claim 3 wherein the back side of the frame body further includes a plurality of reinforcing ribs located in close proximity each the prong, each of the reinforcing ribs extending generally across the width of the frame body adjacent to the base of each prong.

5. The cover assembly of claim 1 wherein the speaker cover in made of a malleable material, the speaker cover attaches to the frame body by a abutting the front side of the frame body, the speaking cover bending around the side edge of the frame body and second rib, and further bending over the second rib into the channel.

6. The cover assembly of claim 5 wherein each notch further provides a sufficient depression in the speaker cover relative to the top of the second rib to define a prying surface allowing the cover assembly to be disengaged from the speaker support frame structure.

7. The cover assembly of claim 1 wherein the speaker cover is made of a cloth-like material, the speaker cover attaches to the frame body by abutting the front side of the frame body, the speaker cover wrapping around the side edge of the frame body and the second rib, and further wrapping over the second rib, gathering into the channel, the speaker cover being pinched between the second rib and the speaker support frame structure when assembled.

8. A speaker support frame assembly for mounting a speaker on a wall, cabinet, or the like, the speaker assembly comprising:

a speaker support frame structure having a front side and back side, the speaker housing support frame structure further having an aperture for receiving therethrough body portions of the speaker and a flattened perimeter region extending about the open central region and adapted for making abutting engagement with the speaker;

a one-piece, unitary, molded frame body having a flattened, annular-shape defining an open central region, the frame body having a front and back side, the back side having means for disengagingly attaching to the speaker support frame structure, the back side further having a first and second upstanding rib extending at least a portion of the length of the frame body and defining a U-shaped channel between them, the first rib located nearest the open central region, the second rib periodically cutback to define a plurality of notches wherein only the first rib upstands from the frame body; and a one-piece, unitary speaker cover for substantially covering the open region, the speaker cover attaches to the frame body.

9. The speaker assembly of claim 8 wherein the attachment means further includes a plurality of apertures located in the perimeter region and a corresponding plurality of prongs upstanding in a perpendicular position to the back side of the frame body, the prongs periodically spaced to frictionally engage each corresponding aperture in the perimeter region.

10. The speaker assembly of claim 9 wherein each aperture further includes a grommet encircling the aperture to improve the frictional engagement with the prong on the perimeter region.

11. The cover assembly of claim 9 wherein the back side of the frame body further includes a plurality of reinforcing ribs located in close proximity to each prong, each of the reinforcing ribs extending generally across the width of the frame body adjacent to the base of each prong.

12. The speaker assembly of claim 8 wherein the perimeter region further includes a shoulder region upstanding frontally therefrom and extending peripherally thereabout, the shoulder being adjacent to the speaker, the shoulder region having an outwardly turned collar region extending peripherally thereabout, the collar region adapted for contacting the exterior side of the wall.

13. The cover assembly of claim 8 wherein the assembly further includes a foam-like gasket positioned between the speaker cover and the front side of the frame body.

14. The cover assembly of claim 8 wherein the speaker cover is made of a malleable material, the speaker cover attaches to the frame body by abutting the front side of the frame body, the speaker cover bending around the side edge of the frame body and second rib and further bending over the second rib into the channels.

15. The cover assembly of claim 14 wherein each notch further provides a sufficient depression in the speaker cover relative to the top of the second rib to define a prying surface allowing the cover assembly to be disengaged from the speaker support frame structure.

16. The cover assembly of claim 8 wherein the speaker cover is made of a cloth-like material, the speaker cover attaches to the frame body by abutting the front side of the frame body, the speaker cover wrapping around the side edge of the frame body and the second rib, and further wrapping over the second rib, gathering into the channel, the speaker cover being pinched between the second rib and the speaker support frame structure when assembled.

17. The speaker assembly of claim 8 wherein the assembly further comprises a speaker attached to the perimeter region of the speaker support frame structure.

* * * * *